(12) United States Patent
Matsumoto et al.

(10) Patent No.: US 6,180,531 B1
(45) Date of Patent: Jan. 30, 2001

(54) SEMICONDUCTOR MANUFACTURING METHOD

(75) Inventors: Yoshishige Matsumoto; Yoshitake Ohnishi; Kazuhiko Endo; Toru Tatsumi, all of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/231,493

(22) Filed: Jan. 14, 1999

Related U.S. Application Data

(62) Division of application No. 08/813,338, filed on Mar. 7, 1997, now Pat. No. 5,866,920.

(30) Foreign Application Priority Data

Mar. 7, 1996 (JP) .................................................... 8-49765

(51) Int. Cl.$^7$ .................................................. H01L 21/302
(52) U.S. Cl. ............................ 438/706; 438/710; 438/719
(58) Field of Search ................................. 257/758, 759; 438/706, 710

(56) References Cited

U.S. PATENT DOCUMENTS

| | | | |
|---|---|---|---|
| 4,493,855 | * 1/1985 | Sachdev et al. | 427/41 |
| 4,863,557 | * 9/1989 | Kokaku et al. | 156/643 |
| 5,017,453 | * 5/1991 | Onishi et al. | 430/176 |
| 5,324,679 | * 6/1994 | Kim et al. | 437/52 |
| 5,698,901 | * 12/1997 | Endo et al. | 257/758 |

FOREIGN PATENT DOCUMENTS

| | | |
|---|---|---|
| 0 696 819 | 2/1996 | (EP) . |
| 5-74962 | 3/1993 | (JP) . |
| 8-83842 | 3/1996 | (JP) . |
| 8-222557 | 8/1996 | (JP) . |
| 8-236517 | 9/1996 | (JP) . |

OTHER PUBLICATIONS

Patent Abstract of Japan 62–136820; Jun. 19, 1987; Inventor: Tamamura Toshiaki; Title—"Formation of Ultramicro Pattern".

K. Endo et al.—"Preparation and Properties of Fluorinated Amorphous Carbon Thin Films By Plasma Enhanced Chemical Vapor Deposition"—vol. 381, Apr. 17, 1995, pp. 249–254.

K. Endo et al.—"Deposition of Silicon Dioxide Films on Amorphous Carbon Films By Plasma Enhanced Chemical Vapor Deposition for Low Dielectric Constant Interlayer Dielectrics", vol. 70, No. 9, Mar. 3, 1997, pp. 1078/1079.

"Dry Etch Substrate Organo Silicone Resist Mask Irradiate Ultraviolet Radiate Treat Hydrofluoric Acid Solution"; Database WPI; XP002054579 & JP 01 089435 (Apr. 3, 1989).

* cited by examiner

*Primary Examiner*—Robert Kunemund
*Assistant Examiner*—Charlotte A. Brown
(74) *Attorney, Agent, or Firm*—Foley & Lardner

(57) ABSTRACT

A semiconductor device, in which wiring layers are electrically isolated from each other by an insulating film which includes an amorphous carbon fluoride film insulating film containing carbon and fluorine as main components and the wiring layers are electrically connected to each other by a conductive material buried in a hole penetrating through the insulating film, is manufactured by selectively etching the amorphous carbon fluoride film. Moreover, a silicon oxide film, a silicon nitride film, or a silicon oxynitride film is formed on both of the amorphous carbon fluoride film and a side surface of said hole, or one of the amorphous carbon fluoride film and the side surface thereof.

15 Claims, 6 Drawing Sheets

SEMICONDUCTOR MANUFACTURING METHOD

This application is a Division of Ser. No. 08/813,338 filed Mar. 7, 1997, now U.S. Pat. No. 5,866,920.

BACKGROUND OF THE INVENTION

1. Field of the Invention

The present invention relates to a semiconductor device having a plurality of stacked wiring layers, i.e., multilayer interconnection layers, and the present invention also relates to a manufacturing method of the semiconductor device which is suitable for forming an insulating layer to constitute the multilayer interconnection layers.

2. Description of the Related Art

With an increase in integration of ultra high semiconductor integrated circuit (hereinafter referred to as an LSI), discrete elements to be formed with a dimensional accuracy less than ¼ µm has been nowadays formed near a silicon substrate.

The LSIs exhibit no functions as a system until fine discrete elements are electrically coupled therebetween with wirings.

When the wrings to couple the individual discrete elements detour in order to avoid crossing of them, however, an area in chips occupied by the wirings increases and a wiring length increases, resulting in a wiring delay. Therefore, in order to prevent crossing points of the wirings and overlapping of them, technologies to couple the discrete elements with wirings having multi-wiring structure have been popularly employed. The multi-wiring structure is realized by arranging an insulating film between the wirings.

FIG. 3 shows a conceptional view of a multilayer interconnection. Referring to FIG. 3, an insulating film 31 is formed on a silicon substrate 1. A contact hole 4 is formed to make a connection to an element formation region 2. A contact plug 4 is formed to bury the contact hole 4, whereby the connection of the element formation region 2 to a first wiring layer 51 is achieved.

Moreover, the connection of the first wiring layer 51 to a second wiring layer 52 is made through a via plug 61 buried in a via hole 61 opened in the insulating film 32. The connection of the second wiring layer 52 to a third wiring layer 53 is made via a via plug 62 buried in a via hole 62 again opened in an insulating film 33. By repeating the above-described process, it will be possible to obtain a multilayer interconnection composed of more stacked layers. Formation of the multilayer interconnection is completed when a finally formed wiring is covered with a sealing film 7.

However, in the technology for the multilayer interconnection in which a thin insulating film is interposed between wiring layers, a large quantity of a floating capacitance between the wirings causes a wiring delay, and cross talk occurs when a signal containing high frequency components through the two wirings holding an interlayer insulating film therebetween is transmitted, resulting in occurrence of erroneous operations.

In order to prevent such wiring delay and cross talk, an increase in a distance between upper and lower wirings holding the interlayer insulating film is required, that is, a thickness of the interlayer insulating film must be set large. On the other hand, when the thickness of the interlayer insulating film is set large, a contact hole and via hole must be formed deeply. The formation of the deep contact hole and via hole makes a dry etching technique to form these holes more difficult. From this viewpoint, it is necessary to make the thickness of the interlayer insulating film thin as possible.

Hereafter, in a semiconductor integrated circuit technology to be put to a practical use after 256 megabits DRAM (dynamic random access memory), a diameter of a contact hole must be less than ¼ µm. From the viewpoint of a dry etching technique, when it is intended to make an aspect ratio, i.e., a ratio of a depth of the contact hole to a diameter thereof, at most less than 5, the thickness of the interlayer insulating film must necessarily be less than about 1 µm.

Moreover, in addition to the above-described problems of the upper and lower wiring layers interposing the interlayer insulating film, problems of wiring delay and cross talk due to an increase in a floating capacitance between wirings formed on the same surface are severer as the integration grade of the semiconductor integrated circuit increase.

The reason of this is as follows. With micronization of the semiconductor integrated circuit, an interval between the wirings reduces as well as a width of the wiring, so that the width thereof becomes necessarily equal to ¼ µm. However, it is not allowed to make the interval of the wirings larger because of the requirement for the high integration of the semiconductor integrated circuit. Therefore, the problems of the wiring delay and cross talk between the wirings disposed in the same surface level are severer than those between the upper and lower wirings interposing the interlayer insulating film, which are solved by making the thickness of the inter-layer insulating film larger.

In order to obtain the wiring delay and cross talk accurately due to the increase in the wiring capacitance, the increase in the wiring capacitance being related to the thickness of the interlayer insulating film as to the upper and lower wirings or related to the integration degree of the semiconductor integrated circuit including the wirings formed on the same surface level, it is necessary to approach the wiring delay and cross talk with means like a distributed constant circuit.

This approach to the wiring delay and cross talk will be described with reference to FIG. 1. FIG. 1 shows a capacitance per unit wiring length between a silicon substrate wiring and a wiring layer insulated by an oxide silicon film of a thickness H (specific dielectric constant: 3.9), disclosed by L. M. Dang et al., IEEE, Electron Device Letters, No. EDL-Vol. 2, p. 196, 1981.

In the above paper, it is disclosed that a capacitance C increases remarkably compared to a capacitance similar to a so called parallel plate, by a fringe effect as the wiring width W reduces. At the same time, the presence of the fringe effect shows the fact that the more increase in the capacitance C is brought about compared to the capacitance similar to the parallel plate when a wiring height H is large.

It seems that an insulating film disposed between a silicon substrate and a lowermost wiring as shown in FIG. 1 is never called an interlayer insulating film. However, the problems of the wiring delay and cross talk are common to this insulating film, and, in the description of the specification for this application of the present invention, the insulating film which is formed directly on the silicon substrate to insulating electrically the wirings shall be also called an interlayer insulating film.

Furthermore, changes of the capacitance Cf per unit length between the wiring and the silicon substrate with advancement of micronization of the interval of the wirings are shown FIG. 2 which is described in the above dissertation. Although a capacitance C11 between the wiring and the silicon substrate reduces with the advancement of the micronization of the interval S of the wirings, a capacitance C12 between the wirings which are adjacent to each other separated by said interval S increases. As a result, when W/H exceeds 1, the capacitance Cf per unit length between the silicon substrate and the wiring increases as the micronization advances.

Specifically, although an operation speed of the elements constituting the semiconductor integrated circuit can be increased by micronizing the elements, when the wirings connecting the elements are micronized, an operation speed of the whole of the semiconductor integrated circuit will never increase because of the increase in the floating capacitance as well as an increase in a wiring resistance.

The results shown in FIGS. 1 and 2 are given by analyzing the floating capacitance between the silicon substrate and the wiring disposed interposing the insulating film. They are not result concerning the floating capacitance between the wirings. However, the qualitatively equal results can be obtained concerning the floating capacitance between the wiring layers. Therefore, in the description in the specification of this application, the films including an insulating film which is inserted between the silicon substrate and the lowermost wiring layer to electrically insulate them shall be called an interlayer insulating film.

To cope with such technical background, development of an interlayer insulating film of small specific dielectric constant$\epsilon_r$ must be hastened, instead of $Si_3N_4$ of specific dielectric constant$\epsilon$–7 and $SiO_2$ of specific dielectric constants$\epsilon$–3.9, which are insulating films popularly used in the semiconductor integrated circuit technology. For substances of small specific dielectric constant, amorphous carbon fluoride films containing carbon and fluorine as main components, which achieves a specific dielectric constant$\epsilon$ less than 3, has been expected. This amorphous carbon fluoride is disclosed in Japanese Patent Laid Open No. Heisei 08-83842 (Prior Art No. 3), No. Heisei 08-222557 (Prior Art No. 4), and No. Heisei 08-236517 (No. Prior Art No. 5). These amorphous carbon fluoride films are formed in such manner that first hydrocarbon type gas and fluorine type gas are changed to plasma gas or CxFy gas is changed to plasma gas, and radical molecules or ions of generated carbon and fluorine react on the silicon substrate to form the amorphous carbon fluoride film. Some amorphous carbon fluoride films contain nitrogen atoms or silicon atoms in order to enhance heat resistance property and etching resistance property.

Since the foregoing amorphous carbon fluoride film has a low specific dielectric constant$\epsilon_r$, it is expected much as an interlayer insulating film in the multilayer wiring structure. However, the amorphous carbon fluoride film involves technical problems on the formations of a contact hole to connect the wiring to a semiconductor diffusion layer and a via hole to connect between the wirings. Consequently, putting to practical use of the amorphous carbon fluoride film is obstructed.

Processes to form an opening in the amorphous carbon fluoride film will be described with reference to Japanese Patent Laid Open No. Heisei 5-74962 (Prior Art 2), which discloses a technology to form a through hole in an interlayer insulating film formed of $SiO_2$ using an ordinary photolithography technique.

An ordinary resist formed by combining phenol resin and photosensitive material or by combining photosensitive material and resin such as cyclorubber is coated on the amorphous carbon fluoride film to a thickness of 1 to 1.5 μm, and a hole of a diameter 0.2 μm is perforated in the amorphous carbon fluoride film, on the supposition of processes for fabricating large scale semiconductor integrated circuit more than 64 megabits DRAM (Dynamic random access memory).

These processes realize the structure as is shown in FIG. 3. Technology to form a contact hole 4 or a via hole 61 or 62, in an amorphous carbon fluoride film 31, 32 or 33 as an interlayer insulating film, will be described.

First, the foregoing ordinary resist film is coated on the amorphous carbon fluoride film. Thereafter, the resist film is subjected to exposure and developing sequentially, thereby forming a selection mask for selective etching. Subsequently, a hole is formed in the amorphous carbon fluoride film using this resist film as a mask by means of an ion milling method.

This ion milling method for opening the hole was employed because the amorphous carbon fluoride film exhibits a strong resistance to acid and alkali so that it can not be etched. However, since perforating of the hole in the amorphous carbon fluoride film is conducted using the ion milling method which is substantially pure physical process, the resist film as the mask itself is etched at the stage of perforation of the hole in the amorphous carbon fluoride film. For this reason, when the resist film of a thickness more than 1 μm was formed, the opening could be hardly formed for the amorphous carbon fluoride film of a thickness less than 0.4 μm. However, the perforation of the opening for the amorphous carbon fluoride film of the thickness more than 0.4 μm was extremely difficult.

Moreover, the resist film must be removed after the perforation of the opening by means of the ion milling method. It was found that a reduction in the thickness of the amorphous carbon fluoride film occurs by a wet processing using a resist removing liquid heated to about 100° C.

The resist removing was tried by means of ashing processing in oxygen plasma. However, it was found that the amorphous carbon fluoride film was rapidly removed together with the resist film also by means of ashing processing. Specifically, working for the amorphous carbon fluoride film by ordinary photolithography techniques is extremely difficult.

SUMMARY OF THE INVENTION

The object of the present invention is to provide a technology which is capable of solving the foregoing problems and selectively forming contact holes and via holes, in a manufacturing method of a semiconductor device which employs an amorphous carbon fluoride film as an interlayer insulating film having a low specific dielectric constant$\epsilon_r$, the amorphous carbon fluoride film being effective on solving problems of wiring delay and cross talk.

Another object of the present invention is to provide a semiconductor device which is capable of greatly enhancing heat resistance required for an interlayer insulating film, adhesion of the interlayer insulating film to wiring, low resistivity of a conductive plug formed in a contact hole and a via hole, and reliability of the conductive plug, and a manufacturing method of the same.

In a manufacturing method of a semiconductor device having an amorphous carbon fluoride film as an interlayer insulating film, which contains carbon and fluorine as main components, the manufacturing method of the present invention achieves selective formations of the contact hole and the via hole in the interlayer insulating film by etching the amorphous carbon fluoride film containing carbon and fluorine as the main components using a silicone type resist as a selective etching mask.

Furthermore, the formations of the contact hole and the via hole can be conducted more easily when the etching is performed using oxygen plasma and using the foregoing silicone type resin as the mask.

Particularly, if a negative bias is being applied to an earth electrode of an etched sample during the oxygen plasma etching, an isotropic etching is possible. Thus, a selective etching capable of obtaining a desired shape after etching can be performed with a slight side etching.

After selectively etching the amorphous carbon fluoride film using the silicone type resist as the mask, the silicone type resist can be easily removed by adopting a method to perform a dry etching in liquid containing hydrofluoric acid which does not etch the amorphous carbon fluoride film or in compound gas containing fluorine. Thus, use of resist remover of complex chemical composition is not necessary. Therefore, clean resist removing process can be realized.

Moreover, if an oxide film, a nitride film, or an oxynitride film is previously formed on the amorphous carbon fluoride film, by polishing the amorphous carbon fluoride film with a chemical or mechanical means using the oxide film, the nitride film, or the oxynitride film as a terminal point detection means, the amorphous carbon fluoride film having an uneven surface owing to wirings buried therein can be flattened with a good reproducibility. At the same time, the foregoing oxide film, nitride film or oxynitride film serves to increase the adhesion.

Furthermore, by employing the foregoing method, the wirings are electrically insulated from each other by an insulating layer which contains an amorphous carbon fluoride film composed of carbon and fluorine as main components, and the wirings are electrically connected to each other by a conductive material buried in a hole penetrating through the insulating film, whereby a semiconductor device with a small floating capacitance between the wirings can be manufactured, which has a little wiring delay and cross talk.

If the foregoing insulating film includes the amorphous carbon fluoride film containing carbon and fluorine as main components and, at the same time, if the insulating film includes a silicon oxide film, silicon nitride film or silicon oxynitride film, which is formed on at least one major surface of the amorphous carbon fluoride film, the adhesion of the insulating film to a layer formed of such as a metallic material can be enhanced, which is disposed interposing at least the silicon oxide film, silicon nitride film, or silicon oxynitride film which is a composite film of them. Hereafter, we call these films as "the selective film A." Thus, a semiconductor device with a high reliability will be given.

Moreover, if a stoichiometric ratio at an at least interface portion where the selective film A contacts to the amorphous carbon fluoride film is set excessive in silicon or if at least the interface portion where the amorphous carbon fluoride film contacts to the selective film A contains hydrogen, the adhesion is more increased. Thus, the reliability of the semiconductor device is enhanced.

Moreover, if the selective film A is formed at an at least interface between a side wall and the amorphous carbon fluoride film exposed to the side wall of hole penetrating the insulating film, a degree of freedom in formation conditions for a conductive plug, such as heating temperature, buried in this hole is greatly increased. At the same time, a semiconductor device having a conductive plug of a small specific resistance will be given.

Furthermore, if the stoichiometric ratio at the at least interface portion is set excessive in silicon, where the selective film A or silicon oxynitride film, which is formed on the side wall of the hole, contacts with the amorphous carbon fluoride film, a semiconductor device having a high adhesion of the amorphous carbon fluoride with the conductive plug will be given, which is excellent in reliability.

Moreover, if the insulating film includes the amorphous carbon fluoride film containing carbon and fluorine as main components and one of the selective film A formed on at least an upper surface of the amorphous carbon fluoride film, a cross section area of the hole of the amorphous carbon fluoride film is larger than that of the selective film A of the insulating film, and the side wall formed of the selective film A is formed at the at least interface portion between the side wall of the hole penetrating through the insulating film and the amorphous carbon fluoride film exposed to the side wall, the conductive plug of a low resistivity with stability, which conforms with a resist pattern, can be formed without reducing the cross section area due to the side wall.

Prevention of the reduction in the cross section area due to the formation of the side wall, can also achieved by making smaller the thickness of the selective film A, formed on the side wall of the hole, than that of the selective film A included in the insulating film, formed on the amorphous carbon fluoride film.

In the semiconductor device of the present invention, the amorphous carbon fluoride film is employed as an interlayer insulating film, and the opening portion is formed in the amorphous carbon fluoride film and the conductive material is buried in the opening portion, thereby being provided with the structure with high reproducibility and reliability. At the same time, the technology as to a selective etching method for this opening portion is provided.

In the manufacturing method of the semiconductor device of the present invention, (1) a photosensitive silicone resin type resist is used as a selective etching mask, and (2) an etching of an amorphous carbon fluoride film is performed by exposing the amorphous carbon fluoride film to oxygen plasma. Thereafter, (3) the photosensitive silicone resin type resist as the selective etching mask is removed by a fluoric acid etching liquid or in gas containing fluorine, thereby manufacturing the semiconductor device.

Furthermore, when the conductive material is buried in the foregoing opening portion, the side wall formed of the selective film A is previously formed on the side surface of the opening portion, whereby the structure with high reproducibility and reliability can be obtained.

Although the amorphous carbon fluoride film can be etched effectively by exposing it to oxygen plasma, when the ordinary resist is used as a mask in the selective etching, the resist is exposed to the oxygen plasma so that the resist itself is attacked by the oxygen plasma. During this conventional processes, the ordinary resist which is an organic substance composed of carbon atoms as main components is exposed to the oxygen plasma, and the carbon atoms are lost in the form of gas such as carbon monoxide and carbon dioxide. Specifically, this is because exposing the resist to the oxygen plasma is a removal process itself by the well known ashing treatment for the resist.

On the other hand, if the photosensitive silicone resin type resist is used like the present invention, etching using the oxygen plasma, which is capable of effectively etching the amorphous carbon fluoride film, will be possible. This is because since the base range of the photosensitive silicone resin type resist is a compound formed of silicon atoms as main components, this vapor pressure is low so that the resist is never lost, though couplings of silicon and oxygen increase in exposing the resist to the oxygen plasma.

If the selective etching of the amorphous carbon fluoride film could be performed using the conventional ordinary resist as a mask by means of the technique such as the ion milling, it is impossible to employ the ashing treatment to oxygen plasma in a resist removing step after etching while exposing the amorphous carbon fluoride film plasma. Therefore, although a treatment in strong alkali resist removing liquid is necessary, the amorphous carbon fluoride film itself is attacked by the resist removing liquid.

On the other hand, according to the present invention, the amorphous carbon fluoride film also dissolves in aromatic hydrocarbon such as xylene and ketone solvent such as acetone, and hydrofluoric acid liquid such as dilute hydrofluoric acid can be used for more complete resist removal. The amorphous carbon fluoride film itself is not attacked by these liquids so that reproducibility of the processes can be significantly enhanced.

It is natural that only the resist can be completely removed without attacking the amorphous carbon fluoride film by means of dry processes using freon gas, instead of the resist removal in the wet processes by the liquids such as dilute hydrofluoric acid.

Furthermore, when substrate temperature becomes more than 400° C. at the stage of burying the conductive plug after formation of the opening in the amorphous carbon fluoride film, there has been the problems that the fluorine components scatter from the amorphous carbon fluoride film at the opening portion section so that a specific resistivity of the amorphous carbon fluoride film near the opening portion occasinally is lowered and a specific resistivity of the finished conductive plug is increased. In order to prevent such problems, in the present invention, the side wall formed of a silicon nitride film and the like is provided on an inner wall of the opening portion. With the previously provided side wall, the low resistivity conductive plug can be formed with a good reproducibility.

DETAILED DESCRIPTION OF THE PREFERRED EMBODIMENTS

Embodiments of the present invention will be described with reference to the accompanying drawings in detail below.

[First Embodiment]

Figure 1:
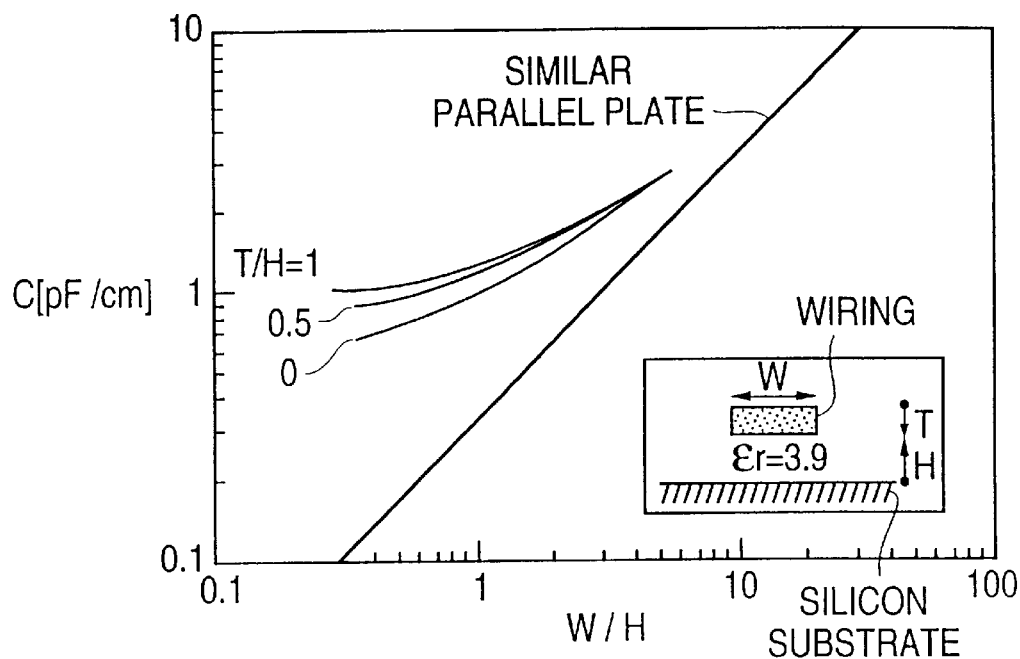
FIG. 1 is a graph showing a relation between a ratio of a width of a insulated isolation wiring to a height from the wiring to a silicon substrate and a capacitance per unit length between the wiring and the silicon substrate.
Figure 2:
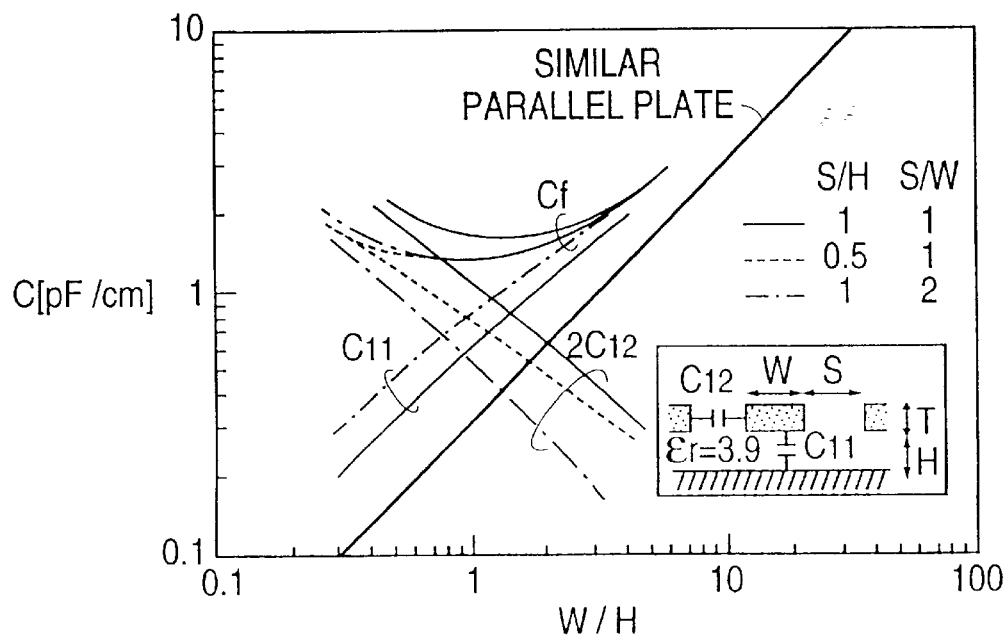
FIG. 2 is a graph showing a relation between a ratio of a width of one of a plurality of wirings arranged in a comb fashion to a height from a silicon substrate to the wiring and a capacitance per unit length between the wiring and the silicon substrate.
Figure 3:
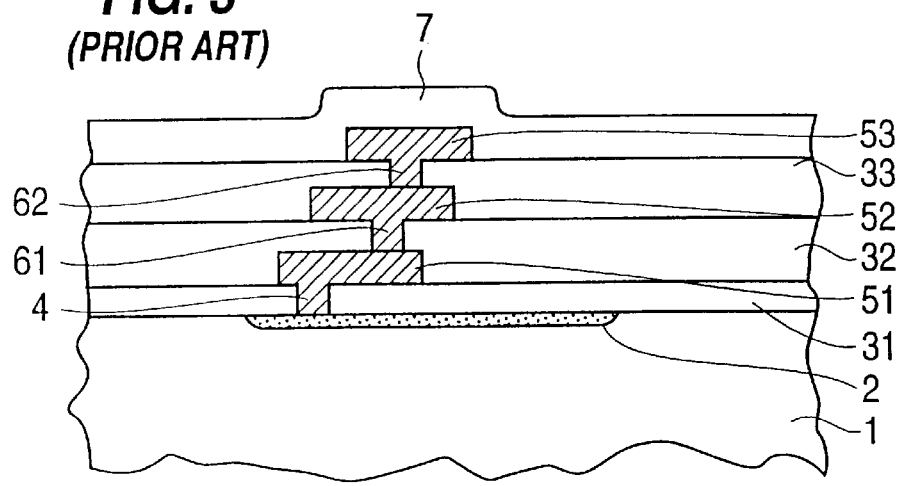
FIG. 3 is a figure showing a structure of a conventional multilayer interconnection.
Figure 4:
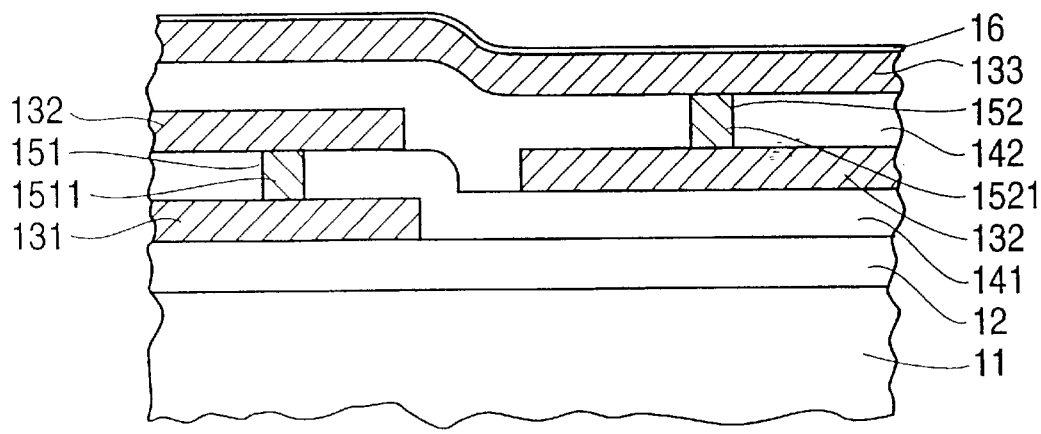
FIG. 4 is a section view showing a finished multilayer interconnection structure obtained in a first embodiment of the present invention.

In this embodiment of the present invention, a multilayer interconnection having a three layer structure as shown in FIG. 4 will be described. It is natural that any multilayer structure may be realized with repeated usage of the following techniques. Manufacturing processes of FIG. 4 are shown in FIG. 5.

First, a final multilayer interconnection structure of a semiconductor device to be manufactured is shown in FIG. 4. The description for the multilayer interconnection structure is made below. A lowermost wiring layer 131 is provided on a silicon wafer 11 interposing an insulating film 12. On the silicon wafer 1, provided is an element region (not shown) such as a diffusion layer. A second wiring layer 132 is provided on the lowermost wiring layer 131 interposing an interlayer insulating film 141. Moreover, a third wiring layer 133 is provided interposing the interlayer insulating film 142.

The uppermost and lowermost wiring layers are electrically connected by via plugs 1511 and 1521 buried in via holes 151 and 152 formed in the interlayer insulating film 141.

FIG. 4 shows a multilayer interconnection having a three layer structure. It is natural that any multilayer interconnection structure may be obtained by stacking wiring layers on another interposing an interlayer insulating film. An insulating film 16 for passivation is usually deposited on the uppermost wiring layer.

In this embodiment of the present invention, an amorphous carbon fluoride film of a low dielectric coefficient, which contains carbon and fluorine as main components, is used as the interlayer insulating films 141 and 142.

(Processes Until Formation of Lowermost Wiring Layer)

Next, a manufacturing method of a section structure shown in FIG. 4 will be described with reference to FIGS. 5(a)–(e), in detail. First, the description is made with reference to FIG. 5(a).

This multilayer interconnection structure of this semiconductor device is formed on an insulating film 12 such as phosphorus glass (PSG), which is previously formed on a silicon wafer 11 by an ordinary chemical vapor phase growth (CVD) technique. In the silicon wafer 11, a diffusion layer and the like (not shown), which are element isolation regions, are formed before the formation of the multilayer interconnection structure.

In the insulating film 12, a connection hole to a semiconductor element on the silicon wafer 11 (contact hole) (not shown) is formed by an ordinary method. It should be noted that an amorphous carbon fluoride film is not used as an insulating film formed directly on the silicon substrate 11 and an ordinary PSG film 12 is used as described above.

Next, a layer for the first wiring layer 131 serving as the lowermost layer is formed on the entire surface of the insulating film 12 by a sputtering method for tungsten. Subsequently, an Al layer having a total thickness of 150 nm is formed by a CVD method. Thereafter, a selective etching mask is formed using an usual lithography technique. The layer for the first wiring layer 131 is subjected to an ordinary dry etching, whereby the first lower wiring layer 131 is obtained. In this embodiment, the minimum line width of the lower wiring layer 131 shall be 0.25 μm, and the minimum wiring interval shall be 0.35 μm.

Next, the formation of the amorphous carbon fluoride film 141 as in interlayer insulating film will be described by the method disclosed in the specifications of Japanese Patent laid Open No. Heisei 8-838428, No. Heisei 8-222557, and No. Heisei 8-236517. Although the film formation method of the amorphous carbon fluoride film is similar to that disclosed in the specification of Japanese Patent Laid Open No. Heisei 8-236517, the film formation method will be described.

The film formation of the amorphous carbon fluoride film is conducted using a plasma apparatus. The plasma apparatus is constructed such that a pair of upper and lower electrodes are disposed in a vacuum chamber, a silicon wafer is placed on the lower electrode, and high frequency of 400 kHz or 13.56 MHz is applied to the lower electrode independently from a plasma source.

With application of the high frequency to the lower electrode, a negative bias of several tens to several hundred volts can be effectively applied to the silicon wafer. Plasma is generated by applying high frequency to an electrode disposed separately from the lower electrode.

Figure 5A:
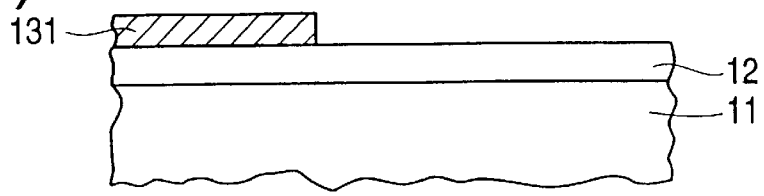
FIGS. 5(a) to 5(e) are section views showing major manufacturing steps of a manufacturing method for forming the multilayer interconnection structure shown in FIG. 4.

The silicon wafer with the insulating film formed thereon, on which the lower wiring layer 131 is formed as shown in FIG. 5(a), is introduced into a preparatory chamber, the preparatory chamber being formed by isolating with a gate bulb at a pre-stage of a plasma generating chamber. Air in the preparatory chamber is evacuated therefrom so that the degree of vacuum is made $10^7$ Torr. Thereafter, the gate bulb is opened and the silicon wafer is introduced into the plasma generation chamber kept at a high vacuum less than $10^8$ Torr, and the silicon wafer is placed on the lower electrode.

Thereafter, when the degree of vacuum in the plasma generating chamber becomes again less than $10^8$ Torr by closing the gate bulb, $CF_4$, $CH_4$, and $N_2$ gases are introduced into the plasma generating chamber, whereby the degree of vacuum in the plasma generating chamber is adjusted to 0.01 to 0.05 Torr. Here, by applying high frequency or direct current to the electrode for plasma generation, glow discharge is made, whereby the amorphous carbon fluoride film 141 is formed (FIG. 5(b)).

It is preferable that temperature of the substrate on deposition of the amorphous carbon fluoride film should be less than 200° C. This is because a deposition speed of the film is substantially zero when the temperature of the substrate exceeds 200° C. Dependency on temperature of the deposition speed is not made yet clear. It is considered that an adhesion coefficient of reaction seeds to the substrate for formation of the amorphous carbon fluoride film may reduce rapidly with an increase in the temperature.

The reason why nitrogen is added to raw material gas in this embodiment, is to increase the heat resistance of the amorphous carbon fluoride film as described in the specification of Japanese Patent Application No. Heisei 7-35023. It is natural that the technology of the present invention may be effectively applicable to the amorphous carbon fluoride film to which no nitrogen gas is added.

As film forming raw material gas for forming the amorphous carbon fluoride film, at least one gas selected from fluorine gases such as $CF_4$, $C_2F_6$, $C_3F_8$ and $CHF_3$ can be employed, as a matter of course. Moreover, it is natural that gas obtained by mixing hydrogen gas $H_2$ with them or gas obtained by mixing at least one gas selected from hydrocarbon gas $CH_4$, $C_2H_6$, $C_2H_4$, $C_2H_2$, and $C_3H_8$ with them may be employed. Fluorine gas such as SF6 and NF3 and the above mentioned hydrocarbon gas may be employed.

Furthermore, as a material to introduce nitrogen, nitrogen gas $N_2$ may be added for forming the amorphous carbon fluoride film, and at least one selected from NO, $NO_2$, $NH_3$, and $NF_3$ also may be added for forming the amorphous carbon fluoride film.

(Apparatus for Forming Amorphous Carbon Fluoride Film)

Moreover, in order to carry out a plasma method for forming the amorphous carbon fluoride film according to the present invention, an apparatus having an ordinary plasma chamber of parallel plate type may be used. It is a matter of course that in order to increase throughput, various kinds of plasma sources such as an ECR (Electron Cyclotron Resonance) plasma source advantageous for high density plasma generation and a silicon wave plasma source may be employed.

As disclosed in the specification of Japanese Patent Application No. Heisei 7-21429, formation of the amorphous carbon fluoride film containing scarcely any hydrogen will be possible, especially depending on a high density plasma source represented by the silicon wave plasma source, in which a substrate and a plasma generation electrode are individually arranged. At the same time, as described later, the high density plasma source is advantageous in burying an interlayer insulating film between wiring layers of a large aspect ratio with a good flatness. Little content of hydrogen in the amorphous carbon fluoride film is very important in a sense of heat resistance of the interlayer insulating film.

(Dielectric Constant, Composition, and Constitution of Amorphous Carbon Fluoride Film)

For composition of the amorphous carbon fluoride film, it is desirable that the content of carbon should be less than 70% in order to obtain a low dielectric constant less than 3.

On the other hand, in order to increase adhesion in case of using as the interlayer film, in order to prevent peeling-off at an interface between the under film and the interlayer film, and in order to prevent peeling-off at an interface in the case where a wiring metal is formed after formation of the amorphous carbon fluoride film, the composition is sometimes changed in a film thickness direction in such manner that the content of fluorine at the interface is made extremely small and the carbon content is made more than 70%. The technology of the present invention can be applicable to such film.

Moreover, when a silicon oxide ($SiO_2$) film, a silicon nitride (SiNx) film, or an oxynitiride (SiON) film which is a complex film formed of the silicon oxide film and the silicon nitride film is formed as a lower thin film of about several nm under the amorphous carbon fluoride film, an increase in adhesion can be brought about. Particularly, in the silicon oxide film and the silicon nitride film, the excessive content of silicon in them compared to their stoichiometric ratio increases more adhesion.

The reason why adhesion increases is thought that carbon atoms in the amorphous carbon fluoride film couple with silicon atoms in the silicon oxide film or the silicon nitride film to form strong Si—C chemical bonds. This fact is realized from more increase in adhesion when the stoichiometric ratio of the silicon oxide film and the silicon nitride film is excessive in silicon.

Moreover, an addition of hydrogen to the amorphous carbon fluoride film of several nm thick serving as an interface between the silicon oxide film and the silicon nitride film is effective to increase the adhesion. When the foregoing carbon film hardly containing fluorine is disposed at the interface, addition of hydrogen increases the adhesion.

Effects of hydrogen is considered to promote isolation of silicon atoms in the silicon oxide film and silicon nitride film. As a result, it is thought that strong Si—C chemical bonds are formed easily so that the increase in the adhesion is brought about.

(Formation of Opening in Amorphous Carbon Fluoride Film)

Figure 5B:
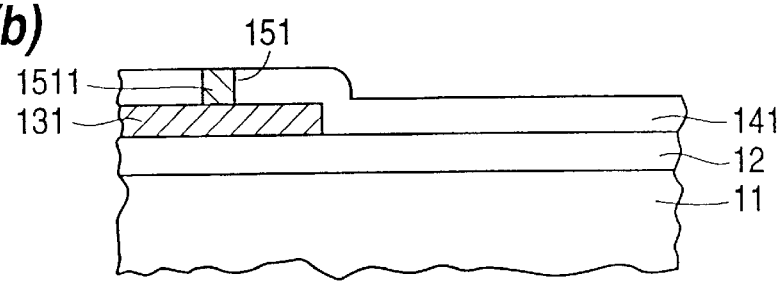

Next, processes for forming a via hole 151 in the grown amorphous carbon fluoride film and for forming a via plug 1511 will be described with reference to FIG. 5(b).

First, a photosensitive silicone type resist is used as a photoresist. The photosensitive silicone type resist is coated by a spinner (not shown). The coated resist is exposed so that selective etching pattern (not shown) is formed to open the via hole 151.

Subsequently, selective etching for the amorphous carbon fluoride film 141 is conducted. The selective etching was conducted according to the oxygen plasma method instead of the ion milling method. Well known conditions of ashing of the ordinary resist can be principally employed as those of dry etching in the oxygen plasma method, whereby the selective etching is possible over wide range of conditions.

However, in order to form a fine pattern of a large aspect ratio having a diameter of as small as 0.2 μm compared to the depth, the via hole 151 is formed under the conditions that a negative bias of several tens to several hundred volts is applied to one electrode on which the substrate is placed, in similar manner to the formation of the amorphous carbon fluoride film. Thus, the side etching can be controlled in the formation of the via hole 151.

Figure 6:
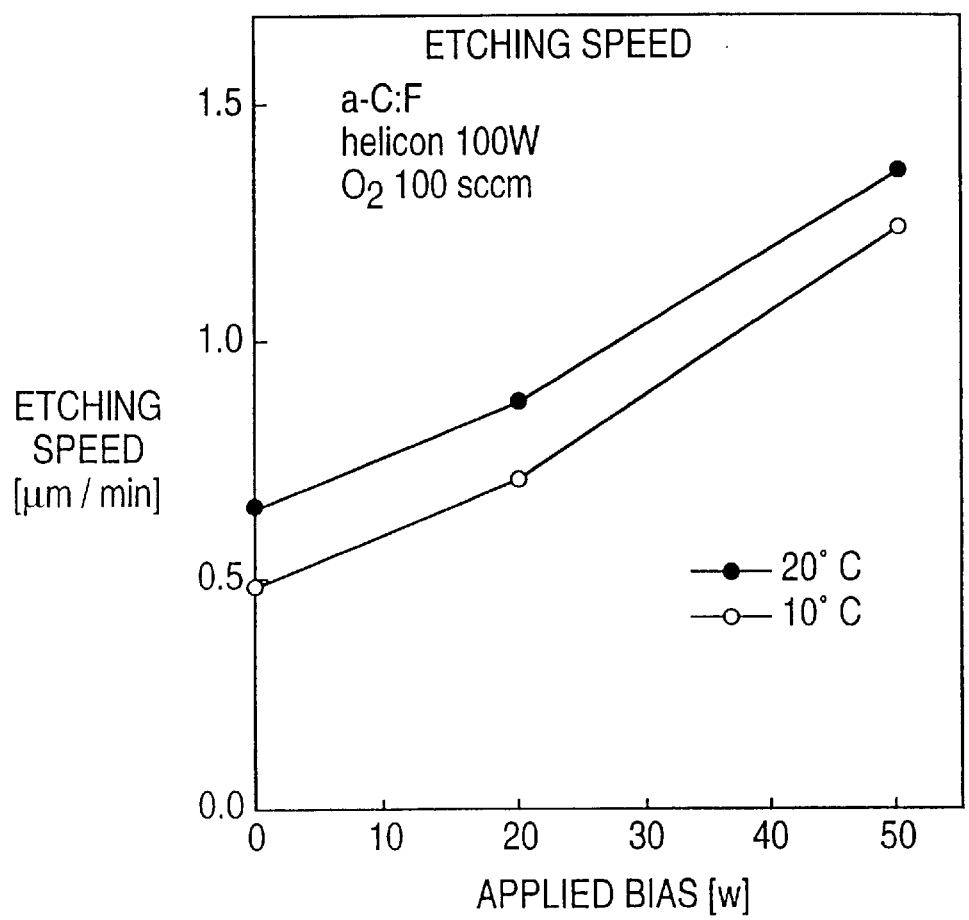
FIG. 6 shows an etching speed in a film thickness direction for a magnitude of a negative bias applied to a silicon wafer earth electrode in a selective oxygen plasma etching of an amorphous carbon fluoride film.

FIG. 6 shows an etching speed in a film thickness direction of amorphous carbon containing fluorine for a negative bias applied to one electrode on which the substrate is placed. When the negative bias is zero, the side etching of at least about 70% of the etching speed in the film thickness direction is observed at an upper portion of the opening. By applying the negative bias of −60 V, the etching speed in the film thickness direction becomes three times. The side etching quantity reduces adversely so that the side etching is hardly observed.

When the amorphous carbon fluoride film 141 is etched, an effect that etching time is shortened to 1/10 is exhibited as well as fidelity of the pattern by using the oxygen plasma method instead of the ion milling method.

Moreover, the ion milling method has been used as the last resort from the following reason. In the oxygen plasma etching, if ordinary phenol resin is used as a base resin, the photoresist itself is ashed by exposing the photoresit to the oxygen plasma so that the photoresist is etched when the amorphous carbon fluoride film is etched. By using the photosensitive silicone resin type resist, only the amorphous carbon fluoride film 141 will be selectively etched without apprehending that the resist is lost.

When the base resin of the resist is ordinary organic substance formed of carbon and hydrogen as main components, which includes no phenol resin type silicon, carbon contained in the resist changes to carbon dioxide gas or carbon monoxide gas with exposure to the oxygen plasma, whereby the resist material itself is lost.

The base resin of the photosensitive silicone resin type resist is formed of polyrudder siloxane or end hydroxy polyrudder siloxane, or both of them, disclosed in Japanese Examined Patent Publication No. Shou 40-15989 and U.S. Pat. No. 3,017,386.

Since these base resin materials are compounds that include Si atoms, although bonds of Si and oxygen increase in the base resin material on exposing to the oxygen plasma, the base resin materials are never lost. Therefore, these base resin materials are preferable.

Another advantage of the usage of the photosensitive silicone resin type resist as the resist is that hydrofluoric acid type liquid can be employed for removing the resist.

Specifically, in the case where the resist is removed after etching by the conventional ion milling method, the amorphous carbon fluoride film 141 itself can not resist in the foregoing so called ashing treatment of the resist and can not used. The resist must be removed by strong alkali resist removing liquid which is heated to about 100° C. However, the amorphous carbon fluoride film 141 dissolves in the strong alkali resist removing liquid heated to about 100° C.

On the other hand, the photosensitive silicone resin type resist also dissolves in solvent of aromatic hydrocarbon such as xylene and ketone type solvent, and the photosensitive silicone resin type resist is removed easily by hydrofluoric acid liquid such as dilute hydrofluoric acid. These liquids do not dissolve the amorphous carbon fluoride film 141 itself, whereby reproducibility of the process increases.

As a matter of course, by dry etching using gas such as fleon gas containing fluorine such instead of resist removal in the wet process using an etchant such as dilute hydrofluoric acid, the resist alone can be perfectly removed without dissolving the amorphous carbon fluoride film 141.

(Burying of Conductive Plug)

After the formation of the via hole 151, the step advances to a process to bury the conductive plug 1511 in the via hole 151 by means of tungsten CVD.

First, in order to increase adhesion of a titanium film and a titanium nitride film with the insulating film, both films are formed in a thickness of at least several nm by sputtering. Thereafter, a tungsten film to completely fill the via hole 151 is formed by means of CVD method using $WF_6$ gas as a raw material.

Next, the tungsten film deposited except in the via hole 151 is removed by dry etching, whereby the surface of the interlayer insulating film is exposed. By this process, tungsten is buried only in the via hole 151. Thus, the conductive plug 1511 is formed.

(Processes after Formation of Second Wiring Layer)

Figure 5C:
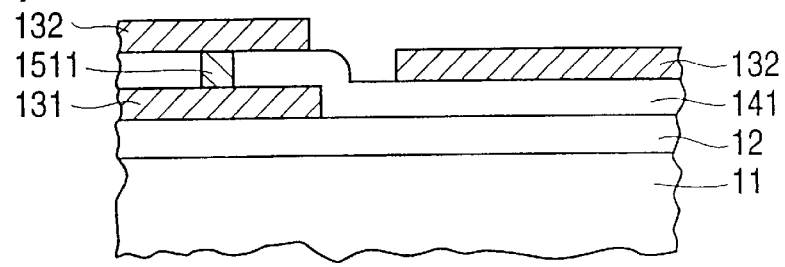
Figure 5D:
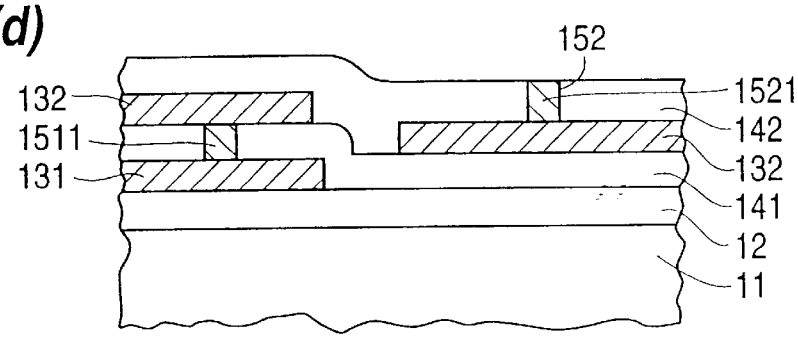

Second wiring layer formation processes will be described along with FIGS. 5(c) and 5(d). A titanium film and a titanium nitride film are stacked for forming the second wiring layer 132. The films are subjected to patterning in the same manner as the case of the first wiring layer, whereby the second wiring layer 132 is formed. Thereafter, the amorphous carbon fluoride film 142 is formed again, and a via hole 152 is opened. Further, by coating of tungsten and dry etching, the conductive plug 1521 is buried.

Figure 5E:
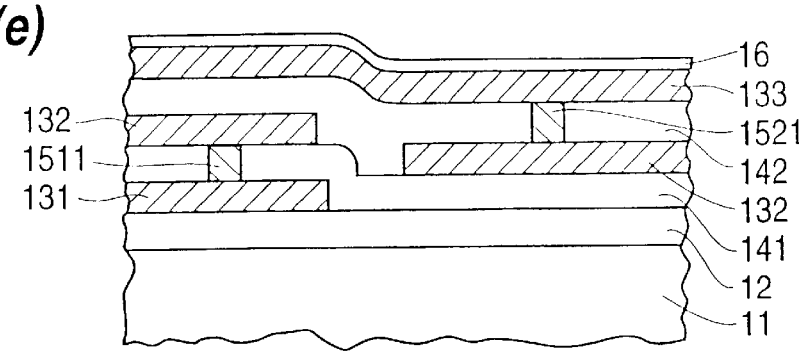

Thereafter, as shown in FIG. 5(e), if the foregoing processes such as formation of the third wiring layer metal 133 and patterning of the film 133 are performed repeatedly, a multilayer interconnection of the desired number of layers is completed. Finally, after the formation of the passivation film 16 formed of $SiO_2$ or $SiN_4$, the semiconductor integrated chip having many multilayer interconnections is completed on the silicon wafer.

[Second Embodiment]

Before the step for burying tungsten in the via hole or the contact hole, it is advantageous that a side wall such as a silicon nitride film is previously formed on the side surface of the via hole or the contact hole.

By adoption of the side wall, a degree of freedom on determination of conditions for burying process of the conductive plug to be buried in these holes is greatly increased, whereby the conductive plug of a low resistance can be formed with a good reproducibility.

Figure 7:
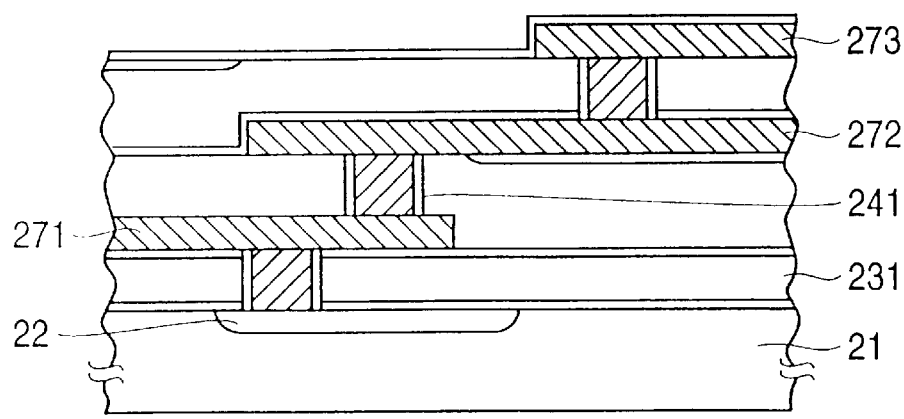
FIG. 7 is a section view showing a finished multilayer interconnection structure obtained in a second embodiment of the present invention.

A multilayer interconnection structure having a cross section of FIG. 7 will be described as an example of the second embodiment of the present invention. The features of the second embodiment are that the side wall is formed on a side surface of the via hole or the contact hole, and the amorphous carbon fluoride film 231 is employed also as the insulating film 231 disposed between the lowermost wiring 271 and the diffusion layer 22 formed in the silicon wafer 21.

Figure 8A:
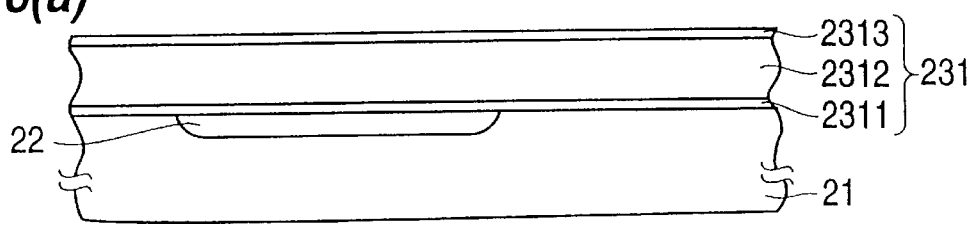
FIGS. 8(a) to 8(h) are section views of one of major manufacturing steps of a manufacturing method for forming the multilayer interconnection structure shown in FIG. 7.

A manufacturing method of the second embodiment will be described with reference to FIGS. 8(a) to 8(h), which show manufacturing steps of the semiconductor device of the present invention. As shown in FIG. 8(a), the insulating film 231 is first formed on the surface of the silicon wafer 21, in which the diffusion layer 22 is formed. For the insulating film 231, a thin silicon oxide film 2311 of 5 nm thick is first formed on the surface of the silicon wafer 21 by oxidation method or CVD method, and, subsequently, an amorphous carbon fluoride film 2312 of 400 nm thick is formed by the foregoing method. Finally, a thin silicon oxide film 2313 of 5 nm thick is formed.

The formations of the silicon oxide films 2311 and 2313 on and under the amorphous carbon fluoride film 2312 increases the adhesion of the amorphous carbon fluoride film 2312.

Next, steps for opening the contact hole 241 to connect the diffusion layer 22 with the lowermost wiring 271 begin. Here, the foregoing silicone type resist is coated, exposed, and developed (resist step is not shown), thereby forming a resist mask for etching the contact hole 241. Subsequently, the silicon oxide film 2313 is etched using hydrofluoric acid type etching liquid. The amorphous carbon fluoride film 2312 is etched by the foregoing oxygen plasma, and, then, the silicon oxide film 2311 is etched by the hydrofluoric acid etching liquid. Thus, the contact hole 241 is opened (FIG. 8(b)).

Since the hydrofluoric acid etching liquid is used on etching the silicon oxide films 2311 and 2313, the silicone type resist is etched a little. However, the total thickness of all silicon oxide films is as thin as 10 nm, an etching quantity of the silicone type resist is negligible.

Insulating performance of the amorphous carbon fluoride film is inferior to that silicon oxide film so that the thickness of the silicon oxide films 2311 and 2313 must be sometimes large. In this case, a two layer structure resist composed of the silicone type resist and ordinary novolak type resist may be used.

When the upper silicon oxide film 2313 is thick, an ordinary resist in which the novolak type resist is disposed on the silicone type resist may be used. When the lower silicon oxide film 2311 is thick, the novolak type resist should be disposed under the silicone type resist.

There are some fear for increase in dielectric constant of the interlayer insulating film due to insertion of the thick silicon oxide film. From the following reason, there is hardly necessity to hesitate the insertion of the insulating film of a large dielectric constant to increase the adhesion.

After two insulating films that have the same thickness are stacked, both films having specific dielectric constants $\epsilon 1$ and $\epsilon 2$, respectively, electrodes are formed on the front and back surfaces of the stacked film. When a capacitance of them is measured, the measurement gives the result showing that the two insulating films are equivalent to an insertion of an uniform dielectric substance of a specific dielectric constant expressed by geometric mean of specific dielectric constants:

$$\epsilon_r = 2\epsilon 1 \epsilon 2/(\epsilon 1 + \epsilon 2).$$

Specifically, assuming that the foregoing stacked is composed of an amorphous carbon fluoride film of a specific dielectric constant $\epsilon 1 = 2.1$ and a silicon oxide film of a specific dielectric constant $\epsilon 2 = 3.9$, an equivalent dielectric constant $\epsilon_r = 2.73$. A dielectric constant of the interlayer insulating film is made sufficiently low.

(Side Wall Method)

Figure 8B:
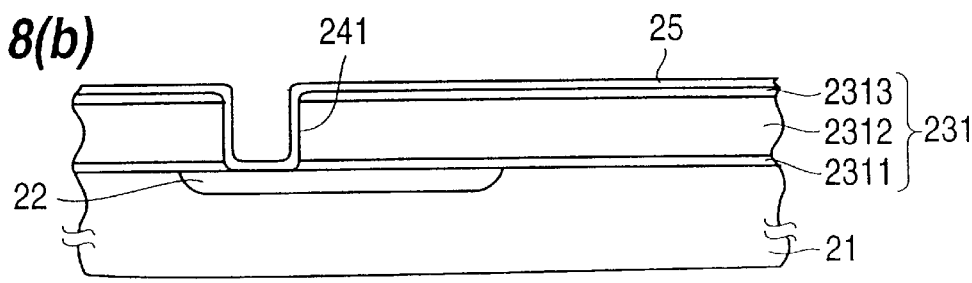

After the contact hole is formed by the above described steps, as shown in FIG. 8(b), the silicon nitride film 25 of 300 nm thick is formed by CVD method.

Figure 8C:
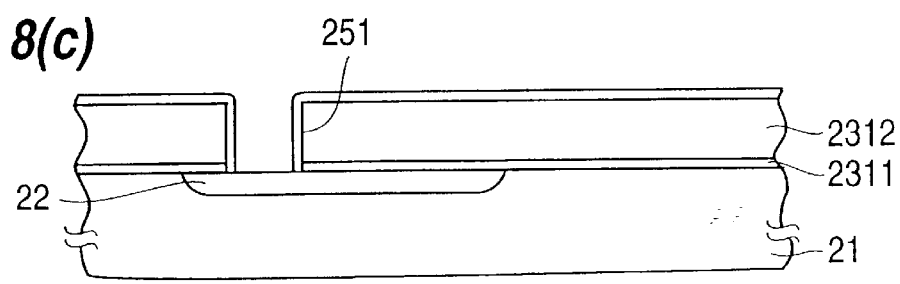

Moreover, if an anisotropic etching similar to the case of the well known silicide process is conducted for the silicon nitride film 25, the silicon nitride film side wall 251 is formed on the inner wall of the contact hole 241 as shown in FIG. 8(c).

Figure 8D:
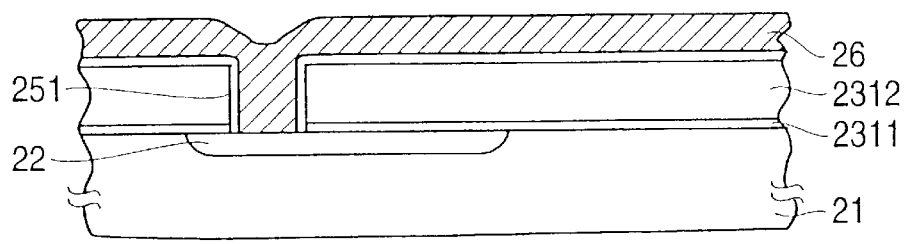

Next, as shown in FIG. 8(d), the conductive film 26 such as tungsten is formed by CVD method in the same manner as the first embodiment.

Figure 8E:
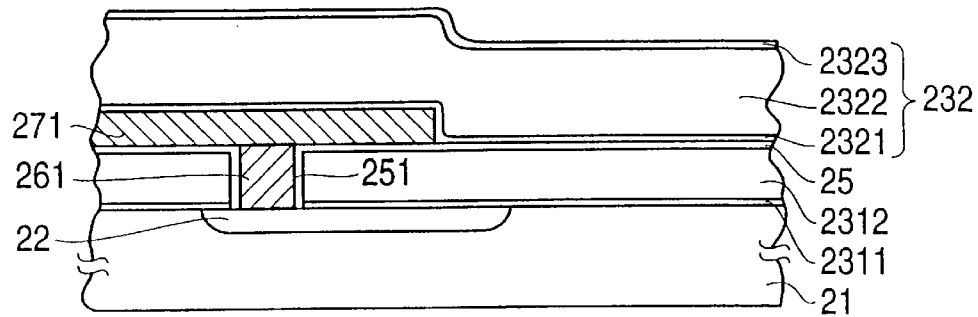

The conductive film deposited at the portion other than the contact hole 241 is removed by dry etching, whereby the surface of the interlayer insulating film 231 is exposed. After these processes, as shown in FIG. 8(e), tungsten is buried only in the contact hole 241 so that the conductive plug 261 is formed.

In this embodiment, the silicon nitride film is used as the side wall 251. However, either a silicon nitride film or an oxynitride film may also be used.

Furthermore, if the composition of at least a film adjacent to the amorphous carbon fluoride film 2312, which is exposed to the side wall of the selective film A, is made excessive in silicon compared to each stoichiometric ratio, adhesion of these films to the side wall increases.

It is unnecessary to form the side wall 251 applied to this embodiment over the cross section of interlayer insulating film 231. It is sufficient for the side wall to cover the cross section of the amorphous carbon fluoride film 2312. This serves greatly to increase the reproducibility of the side wall etching and brings about an reduction in resistance of the conductive plug by increasing the cross section thereof. This process will be described using FIGS. 8(g) and 8(h) corresponding to FIGS. 8(b) and 8(c).

Figure 8F:
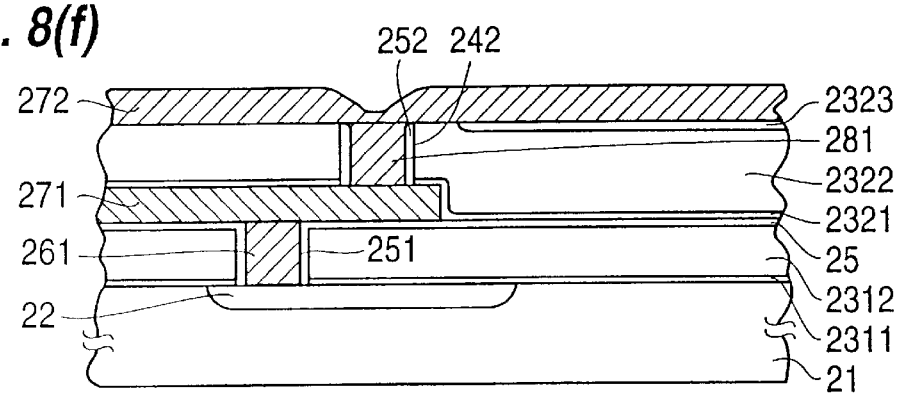
Figure 8G:
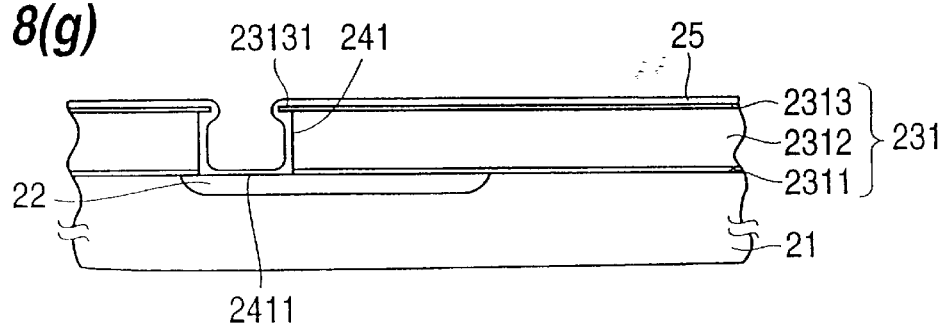

FIG. 8(g) shows a stage that side etching of the amorphous carbon fluoride film 2312 is conducted until the side of the film 2312 is etched by 200 nm after the film 2312 is slightly over-etched by the plasma etching and the silicon nitride film 25 is formed. In this case, a flaw 23131 occurs in the oxide film 2313.

Figure 8H:
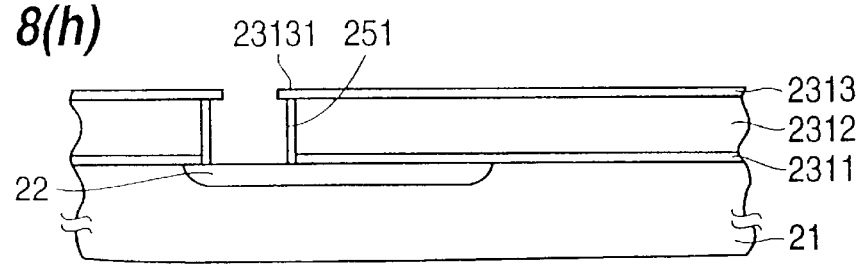

Thereafter, as shown in FIG. 8(h), the side wall 251 is formed by an anisotropic etching. On the formation of the side wall 251, when it is tried to certainly form the side wall 251, the silicon nitride film 25 sometimes remains at the bottom 2411 of the contact hole 241.

However, if the structure of FIG. 8(g) is etched, the nitride film 25 formed on the cross section of the amorphous carbon fluoride film 2312 is protected by the eave 23131 of the upper oxide film 2313 as shown in FIG. 8(h). Therefore, etching to form the side wall 251 can be continued theoretically sufficiently until the eave 23131 at least disappears. However, it suffices that the etching is stopped before the eave 23131 disappears. At the same time, stopping the etching before the eave disappears is preferable for completely sealing the amorphous carbon fluoride film 2312.

In addition, if the oxide film 2313 is formed so as to have a lager film thickness than that of the side wall nitride film 25, this process will be extremely stable, and the low resistivity conductive plug may be formed with reproducibility certainly covering the amorphous carbon fluoride film 2312. Specifically, the nitride film 25 at the bottom 2411 of the contact hole 241 can be securely removed and stable low resistivity contact characteristics can be obtained.

(Effectiveness of Side Wall)

If the side wall 251 is previously formed before coating of the conductive layer 26 as in this embodiment, a large margin is created in formation process conditions of the conductive film 26.

Specifically, in the case where the side wall 251 is not provided as the first embodiment, there is a restriction that a heating temperature of the silicon wafer must be 400° C. or less when tungsten is deposited for the formation of the conductive film using a technology such as a CVD method.

In the case where the side wall 251, for example, is not employed, an unexpected problem when a silicon oxide film is used as an interlayer film, is produced that, at a temperature of 400° C. or more, fluorine leaves from the cross section surface of the amorphous carbon fluoride film, which is exposed to the inner wall of the contact hole 241, so that an insulation property of the amorphous carbon fluoride film is damaged.

On the other hand, if the side wall 251 is provided as this embodiment of the present invention, it is possible to form the conductive film 26 at a temperature of 400° C. or more. The formation of the tungsten film at a temperature of 400° C. or less produces the problems of a reduction in a film formation speed and an increase in resistivity of the formed film. Therefore, reliability of the processes is increased by forming the side wall 251 with the structure having the amorphous carbon fluoride film.

(Adoption of CMP technology on Formation of Multilayer Interconnection)

After the formation of the conductive plug 261 for contact, as shown in FIG. 8(e), the first wiring layer 271 is formed in the similar manner to the first embodiment. The second insulating film 232 is formed in the similar manner to the case of the lower insulating film 231, which is constituted by the amorphous carbon fluoride film 2322 provided between the upper and lower silicon oxide films 2321 and 2323.

In this embodiment, after this, a process to flatten the difference in level of the surface of the insulating film 232 by a chemical machinery polishing (CMP) was introduced.

In this CMP process, the upper silicon oxide film 2323 constituting the insulating film 232 functions effectively to detect the final point of the CMP. Specifically, at the time when the silicon oxide film 2323 is left only in the recessed portion of the amorphous carbon fluoride film 2322 in FIG. 8(e), the polishing is finished as shown in FIG. 8(f). According to this, since the silicon oxide film 2323 is harder than the amorphous carbon fluoride film 2322, a polishing speed drops. As a result, detection of the final point of CMP is easy.

After completion of the CMP polishing, the via hole 242 is formed conforming to the method of the formation of the contact hole 241. When the via hole 242 is bored on the surface where the silicon oxide film 2323 is not present as in the case shown in FIG. 8(f), the treatment is unnecessary with hydrofluoric acid type etching liquid, prior to etching of the amorphous carbon fluoride film 2322 with oxygen plasma described in the first embodiment.

On the deposition of the next wiring layer 272, in order to prevent the second wiring layer from peeling off from the surface where the silicon oxide film 2323 is not present, a titanium film and a titanium nitride film must be previously deposited.

In the above described CMP, the silicon oxide film was used for the insulating film 2323. Alternatively, a silicon nitride film or an oxynitride film may be used for the insulating film 2323.

The descriptions of the wiring and the conductive plug made of this embodiment, were made for titanium type and tungsten type wiring and conductive plug. Alternatively, conductive materials including polysilicon, aluminum type, and copper type materials may be employed, which have been employed so far.

Moreover, the usage of the technology for formations of the titanium layer or titanium nitride layer under the conductive layer has been always effective, in order to increase adhesion of the conductive material to the insulating film.

Alternative usage between the silicon oxide film, silicon nitride film, and oxynitride film in this embodiment never reduces the effects of the present invention.

The selective etching of the interlayer insulating film including the amorphous carbon fluoride film using phenol resin type resist or cyclorubber type resist has been difficult. In the present invention, the amorphous carbon fluoride film including carbon and fluorine as main components is subjected to the selective etching using silicone type resist as a selective etching mask, whereby workings for forming the contact hole and the via hole in the interlayer insulating film will be conducted easily by means of the oxygen plasma etching.

When a negative bias is previously applied to the earth electrode of the sample to be etched at the time of the oxygen plasma etching, an anisotropic etching is possible, making it possible to perform the selective side etching closely following the selective etching mask shape.

Therefore, using the foregoing method, the wiring layers are electrically coupled by the conductive material buried in the hole penetrating through the insulating film, each wiring being disposed with electrical isolation from others by the insulating film which includes the amorphous carbon fluoride film containing carbon and fluorine as main components. Therefore, the floating capacitance between the wiring layers will be small, and even in the semiconductor integrated circuit device in which the width of the wiring layer is about 2 μm, the semiconductor device without the problems of the wiring delay and the cross talk will be achieved. It may be said in passing that the wiring delay time in the present invention can be shortened to approximately half of the case where the silicon oxide film is used as the insulating film, provided that the wiring layers of the same shape are employed in both cases.

Moreover, when the selective film A is formed at least on one major surface of the amorphous carbon fluoride film and the whole of the amorphous carbon fluoride film and the film formed thereon works as the interlayer insulating film, the adhesion of the material layer such as the metallic material with the interlayer insulating film can be improved, the material layer being disposed on the amorphous carbon fluoride film interposing the selective film A. Thus, the stability of the processes can be increased, making it possible to finish the semiconductor device with a high reliability.

If a layer containing hydrogen is previously formed near at least the one major surface of the amorphous carbon fluoride film which contacts with the selective film A, the adhesion is more increased, whereby the stability of the processes and the reliability of the semiconductor device can be more increased. In addition, if the stoichiometric ratio at the interface between the selective film A and the at least amorphous carbon fluoride film is excessive in silicon, the same effects can be obtained.

After the amorphous carbon fluoride film is selectively etched using the silicone type resist as a mask, if the method is adopted in which the silicone type resist is subjected to a dry etching by liquid containing fluorine which does not attack the amorphous carbon fluoride film or by compound gas containing fluorine, the silicone type resist can be easily removed. Therefore, it is unnecessary to use a strong alkali resist remover having a complex composition so that a clean resist removing process can be realized.

If the side wall composed of the selective film A, which are arranged at the cross section of the amorphous carbon fluoride film exposed to the side surface of the hole bored in the insulating film including at least the amorphous carbon fluoride film, is formed, the degree of freedom of the forming conditions for the conductive plug to be buried in this hole is significantly increased, and the semiconductor device with a low resistivity conductive plug can be obtained.

Specifically, when the side wall is not provided, a temperature of 400° C. is required for burying the conductive plug. The drawbacks that specific resistivity of the conductive plug formed by such way becomes high occur. However, such problems can be completely resolved by forming the side wall.

Moreover, the composition of the film adjacent to the amorphous carbon fluoride film contains excessive silicon compared with each stoichiometric ratio, the amorphous carbon fluoride film being exposed to the at least side surface of the selective film A, whereby the adhesion of the amorphous carbon fluoride film with the side wall can be increased, and problems of dusts generated due to peeling-off of the side wall, which occurs occasionally at the periphery of the wafer, is resolved.

Moreover, if the insulating film comprises the amorphous carbon fluoride film containing carbon and fluorine as main components, selective film A, formed at least on the upper surface of the amorphous carbon fluoride film; if the opening cross section area of the foregoing hole in the amorphous carbon fluoride film is set larger than that of the hole to make electrical connections between the wiring layers, bored in one of the selective A of the insulating layer; and if the selective film A is provided at the interface of the amorphous carbon fluoride film exposed to the at least side surface of the hole bored in the insulating film, the stable and low resistivity conductive plug conforming to the resist pattern can be formed without reducing the opening cross section area by the side wall.

In order to prevent the reduction in the opening cross section area by the side wall, if the thickness of the portion of the selective film A, which is formed on the side wall of the hole, is set thinner than that of the other portion of selective film A, which is formed at least on the upper surface of the amorphous carbon fluoride film, advantages will be brought about.

For the insulating film including the amorphous carbon fluoride film, on manufacturing the semiconductor device of the present invention, the selective film A to increase the adhesion is formed on the upper surface of the amorphous carbon fluoride film, and the wiring layer is buried therein, so that the unevenness occurs. The insulating film can be flattened with a good reproducibility by polishing using the foregoing selective film A as a final point detection means of polishing, which exist in a concaved portion.

According to the present invention, the semiconductor device having the multilayer interconnection structure can be realized, in which many properties such as a stability and reproducibility of multilayer insulation processes, the degree of freedom, the adhesion between layers, and performance of the conductive plug, can be increased.

What is claimed is:

1. A manufacturing method of a semiconductor device, the semiconductor device including an amorphous carbon fluoride film containing oxygen and fluorine as main components, the method comprising:

selectively etching the amorphous carbon fluoride film using a silicone type resist as an etching mask, the selectively etching step also being performed using oxygen plasma; and during the selectively etching step, applying a negative bias to an earth electrode of the semiconductor device.

2. The manufacturing method according to claim 1, wherein after said amorphous carbon fluoride film is selectively etched using the silicone type resist as the mask, liquid containing hydrofluoric acid is used to remove said silicone type resist.

3. The manufacturing method according to claim 1, wherein after amorphous carbon fluoride film is selectively etched using the silicone type resist as the mask, dry etching for removing said silicone type resist is performed in compound gas which contains fluorine.

4. The manufacturing method according to claim 1, said manufacturing method comprising:

a step for polishing a surface of said amorphous carbon fluoride film to flatten unevenness of the surface of said amorphous carbon fluoride film, by using one of an oxide film, a nitride film and an oxynitride film formed on said amorphous carbon fluoride film as a final point detection means.

5. The manufacturing method according to claim 3, wherein the compound gas which contains fluorine is fleon gas.

6. The manufacturing method according to claim 1, wherein the semiconductor device includes wiring layers that are electrically isolated from each other by said amorphous carbon fluoride film that forms part of an insulating film, and wherein the wiring layers are electrically connected to each other by a conductive material buried in at least one hole formed by way of the selectively etching step.

7. The manufacturing method according to claim 6, wherein the insulating film also includes one of a silicon oxide film, a silicon nitride film, and a silicon oxynitride film, formed on at least an upper surface of said amorphous carbon fluoride film.

8. The manufacturing method according to claim 7, wherein said amorphous carbon fluoride film is at least one order of magnitude greater in thickness than said one of said silicon oxynitride film, said silicon nitride film, and said silicon oxynitride film.

9. The manufacturing method according to claim 7, wherein the thickness of said one of said silicon oxynitride film, said silicon nitride film, and said silicon oxynitride film is approximately 5 nm, and the thickness of said amorphous carbon fluoride film is approximately 400 nm.

10. The manufacturing method according to claim 9, wherein said one of said silicon oxynitride film, said silicon nitride film, and said silicon oxynitride film is formed on both the upper surface and a lower surface of said amorphous carbon fluoride film.

11. A method of manufacturing a semiconductor device having a multilayer interconnection structure, comprising:

forming an insulating film on a surface of a silicon wafer;

forming an amorphous carbon fluoride film on the insulating film;

forming a silicon oxide film on the amorphous carbon fluoride film;

etching the amorphous carbon fluoride film and the silicon oxide film to form at least one via hole in the amorphous carbon fluoride film, the etching also removing a portion of the insulating film laying directly below the at least one via hole; and forming a silicon nitride film by a CVD method using an anisotropic etching, wherein the silicon nitride film forms sidewalls for the at least one via hole.

12. The manufacturing method according to claim 11, wherein the insulating film is a silicon oxide film having a thickness less than a thickness of the first amorphous carbon fluoride film, the silicon oxide film being formed by one of an oxidation and a CVD method.

13. The manufacturing method according to claim 12, wherein the etching step includes the substeps of:

etching the silicon oxide film using a hydrofluoric acid etching liquid; and etching the amorphous carbon fluoride film using oxygen plasma wherein a negative bias is applied to an earth electrode of a sample to be etched.

14. The manufacturing method according to claim 11, wherein the silicon nitride film is formed with excess silicon as compared to each stoichiometric ratio, so as to increase adhesion of the silicon nitride film to inner walls of the at least one via hole.

15. The manufacturing method according to claim 11, wherein side etching of the amorphous carbon fluoride film is performed prior to the forming of the silicon nitride film, thereby forming eaves at a top portion of the at least one via hole so as to protect the silicon nitride film forming the sidewalls of the at least one via hole.

* * * * *